United States Patent [19]

Suzuki et al.

[11] 4,388,342
[45] Jun. 14, 1983

[54] METHOD FOR CHEMICAL VAPOR DEPOSITION

[75] Inventors: Takaya Suzuki, Katsuta; Yosuke Inoue, Tokaimura; Takashi Aoyama, Hitachi, all of Japan

[73] Assignee: Hitachi, Ltd., Tokyo, Japan

[21] Appl. No.: 154,025

[22] Filed: May 28, 1980

[30] Foreign Application Priority Data

May 29, 1979 [JP] Japan .................................. 54-65552

[51] Int. Cl.³ ............................................. B05D 5/12
[52] U.S. Cl. ......................................... 427/8; 436/55; 73/23; 427/9; 427/86; 427/248.1; 427/255
[58] Field of Search ................... 427/46.18, 9, 86, 87, 427/248.1, 255, 255.1, 255.2, 314; 118/712, 725, 729, 730, 733, 728, 690; 23/230 A; 73/23

[56] References Cited

U.S. PATENT DOCUMENTS

| | | | |
|---|---|---|---|
| 2,927,501 | 3/1960 | Busignies et al. | 118/712 |
| 3,461,836 | 8/1969 | Henker | 118/715 |
| 3,900,597 | 8/1975 | Chruma et al. | 427/255 |
| 4,082,865 | 4/1978 | Ban et al. | 427/86 |
| 4,096,301 | 6/1978 | Slominski et al. | 118/690 |
| 4,100,310 | 7/1978 | Ura et al. | 427/86 |
| 4,147,584 | 4/1979 | Garrison et al. | 427/86 |
| 4,148,931 | 4/1979 | Reuschel et al. | 427/8 |
| 4,273,742 | 6/1981 | Huber et al. | 23/230 A |

Primary Examiner—Sadie L. Childs
Attorney, Agent, or Firm—Antonelli, Terry & Wands

[57] ABSTRACT

A method of forming by CVD technique a layer of material with good uniformity and reproducibility on the surfaces of a plurality of substrates supported within the reaction chamber. The feature of the invention is that a gaseous mixture containing a reaction gas is supplied into the reaction chamber from the inlet of the reaction chamber and the auxiliary gas nozzle provided between the inlet and the exhaust in a predetermined control manner. Moreover, part of the gaseous mixture within the reaction chamber is sampled from the gas flow for the measurement of the concentration of the reaction gas, and from the measured results is determined the rate of gas supply from the auxiliary gas nozzle.

12 Claims, 10 Drawing Figures

METHOD FOR CHEMICAL VAPOR DEPOSITION

BACKGROUND OF THE INVENTION

This invention relates to a method of growing a layer of material on the surfaces of a plurality of substrates placed in a reaction vessel by the chemical vapor deposition technique.

In the field of manufacturing semiconductor devices, it is a well known technique to grow a thin layer of silicon or the like on a semiconductor substrate of silicon or the like, or on an insulating substrate of sapphire or the like by use of the chemical vapor deposition (CVD) technique. In the CVD technique, it is desirable to place as many substrates as possible in a reaction chamber and grow on all the substrates a layer of a uniform thickness and a uniform characteristic (for example, uniform resistivity).

In general, the following processes by the CVD technique have been employed so far in order to grow a layer of material. A number of substrates are arranged on a plate-like susceptor in a reaction chamber and heated at a high temperature. Under this condition, a reaction gas is supplied from the inlet of the reaction chamber to the substrates so that a layer of material is grown thereon, and then the gas is exhausted from the exhaust of the reaction chamber.

In such method, however, increase of the number of substrates per batch will tend to make the thickness and resistivity of a layer of material on the substrates ununiform. For example, when thirty substrates of three-inch diameter each were arranged on the plate-like susceptor and processed as described above, the thickness was scattered in value to about 15% and the resistivity to as much as 20%. This cause will be considered that as the reaction gas supplied from the inlet of the chamber approaches to the exhaust, the concentration of the gas decreases due to the growth of a layer of material.

Up to date, different proposals have been made in order to increase the number of substrates per batch to be processed with a layer of material kept uniform. For example, in the U.S. Pat. No. 4,082,865, issued to Ban et al. on Apr. 4, 1978, there is disclosed a method that a plurality of substrates are placed in a reaction chamber in stack-like arrangement and a reaction gas is supplied from a plurality of gas nozzles to the substrates to grow an improved uniform thickness of layer. Also, in the U.S. Pat. No. 3,461,836, issued to Henker on Aug. 19, 1969, there is disclosed another method in which a plurality of substrates are arranged on a plate-like susceptor in the reaction chamber, a reaction gas is similarly supplied from a plurality of gas nozzles to the substrates to form an improved uniform thickness of layer.

In these methods, however, it is necessary to sweep the gas nozzles back and forth in an arc or rotate the substrates in stack-like arrangement, this making the mechanism of the growth apparatus complicated. Moreover, in these methods, it is impossible to control the concentration of the reaction gas at each position within the reaction chamber during the CVD process, and therefore the reproducibility of a layer of material is uncertain when the substrate arrangement is changed.

SUMMARY OF THE INVENTION

An object of the present invention is to provide a novel method for chemical vapor deposition of a layer of material onto a plurality of substrates within a reaction chamber with high uniformity and high reproducibility.

Another object of the present invention is to provide a novel method for controlling the concentration of a reaction gas within a reaction chamber in-process of chemical vapor deposition.

A further object of the present invention is to provide a novel method for chemical vapor deposition of a layer of material onto a large number of substrates at one batch.

The feature of the present invention resides in the fact that when a layer of material is deposited on a plurality of substrates supported within a reaction chamber by the CVD technique, the reaction gas supplied to within the reaction chamber is sampled, the concentration of the sampled reaction gas is measured, and an auxiliary reaction gas is added within the reaction gas on the basis of the measurement. This auxiliary reaction gas is supplied to compensate for part of the reaction gas supplied from the inlet of the reaction chamber which part is consumed in the course of flow to the exhaust due to the deposition of a layer of material.

DESCRIPTION OF THE PREFERRED EMBODIMENTS

Figure 1:
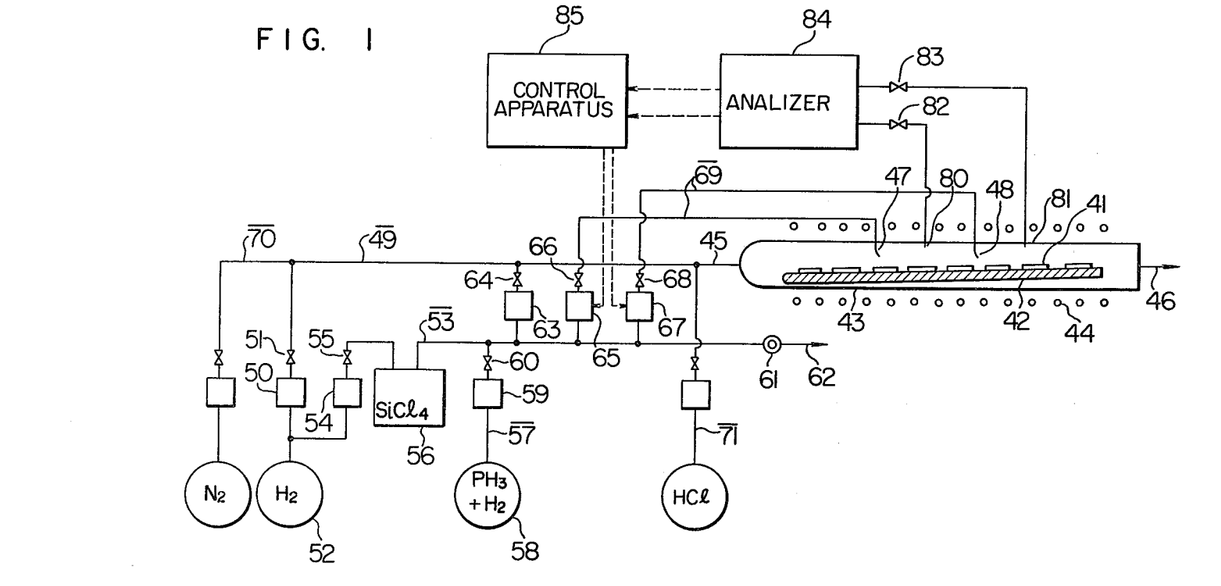
FIG. 1 is a schematical diagram of the whole reaction system to which reference is made in explaining a first embodiment of the invention.

FIG. 1 is a schematical general view of a silicon (Si) single crystal vapor phase deposition apparatus using a most common horizontal reactor, according to the present invention.

As illustrated, Si single crystal substrates 41 are placed in series on a susceptor 42 within a quartz tube (reactor) 43 in the direction of gas flow and heated by an RF work coil 44 provided around the quartz tube. The reaction gas is supplied through an inlet reaction gas conducting tube 45, passed along the surfaces of the substrates 41 and discharged from an exhaust tube 46 for the reacted exhaust gas.

In addition to the construction the same as that of the conventional reactor, the apparatus of this embodiment further includes above the susceptor 42 within the quartz tube 43 auxiliary gas nozzles 47 and 48, and sampling tubes 80 and 81 for taking out part of the reaction gas the concentration of which is detected by an analizer 84. The detected concentrations of the gas at the respective positions along the direction of gas flow are compared with a set value by a control apparatus 85. By the difference signals resulting from the comparison, gas flow adjustors 65 and 67 are operated to adjust gas flows to the auxiliary gas nozzles 47 and 48, respectively, thereby keeping constant the gas concentration along the direction of gas flow above the susceptor 42. In the apparatus of this embodiment, the susceptor 42 is 680 mm long and the auxiliary gas nozzles 47 and 48 are located about 200 mm and 400 mm from the front end of the RF work coil, respectively. The tip ends of the nozzles 47 and 48 are directed to a slightly slant downward direction. The collecting tubes 80 and 81 for taking out part of the reaction gas are located about 100 mm downstream the auxiliary gas nozzles 47 and 48, respectively. The openings of the sampling tubes 80 and 81 are determined to be located at 180 mm, and 220 mm, respectively from an upstream end of the susceptor by the four reasons as will be described later.

Figure 2:
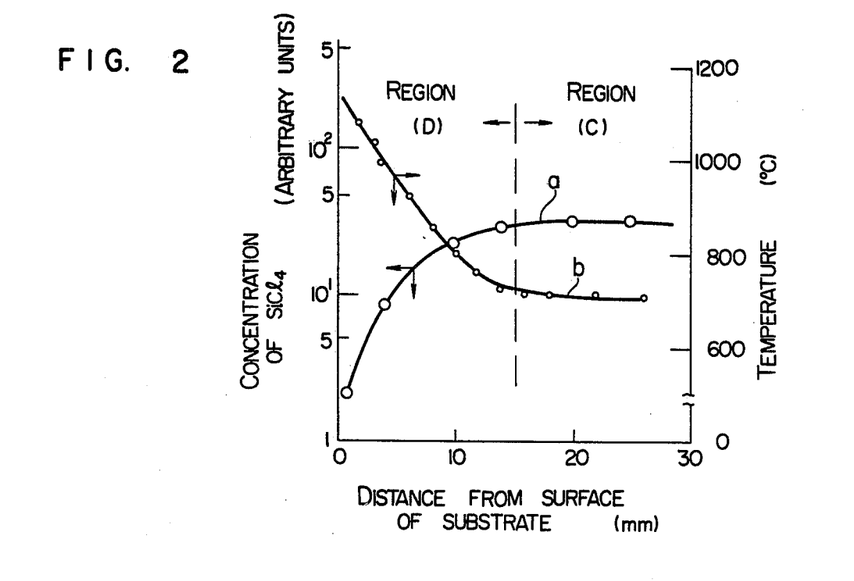
FIG. 2 is a graph of the distributions of SiCl$_4$ concentration and gas temperature in the direction perpendicular to the reaction gas flow along the surfaces of the semiconductor substrates, in the first embodiment of the invention.

FIG. 2 shows the distributions of the reaction gas (SiCl$_4$) concentration a and temperature b in the height (the distance from the substrate surface in the direction perpendicular to the gas flow) direction at the center of the RF work coil 42. Our recent experimental results show that as illustrated, there are a substantially constant zone C of gas concentration and temperature above the substrate surface and a diffusion boundary zone D in which, as the distance from the substrate surface approaches zero, the gas concentration is decreased and the gas temperature increased. These zones C and D are formed along the entire length in the gas flow direction. This is caused by the fact that when the reaction gas comes in contact with the susceptor 42 heated at a high temperature (about 1150° C.), the gas flow is separated into two layers, a turbulent layer due to the convection of gas and a laminar layer of relatively slow gas flow due to the viscosity of gas above the susceptor 42. In the turbulent layer of zone C, the SiCl$_4$ concentration and gas temperature are kept substantially constant due to the proper agitation. In the laminar layer of zone D in which the gas is little agitated, the SiCl$_4$ gas concentration changes in a slope because Si is deposited from SiCl$_4$ by the chemical reaction on the substrate surface so that part of the SiCl$_4$ gas is consumed to change the gas concentration by the mass transport (diffusion). In addition, the gas temperature is distributed with a gradient due to the radiant heat from the susceptor 42.

As described above, the concentration, temperature and flowing condition of the reaction gas are not kept constant in a certain zone of gas flow above the susceptor 42. Thus, in order that, particularly in vapor phase deposition, a deposition layer of uniform thickness and resistivity is formed by monitoring and controlling the concentration of reaction gas in the reactor, it is necessary to monitor the concentration of the reaction gas at a proper position above the susceptor. Experiment ascertained that the position at which the reaction gas concentration within the reactor was monitored should be in the zone C shown in FIG. 2 from the consideration of the following four reasons. In the zone C, (1) since the gas concentration is little changed in the height direction, a small error occurs upon monitoring at the sampling position, (2) since the gas temperature is relatively low, there is no deposition of Si onto the sampling tubes (the deposited Si may fall on the substrate surface to cause crystal defects in the grown layer surface), (3) the insertion of the sampling tubes never disturb the gas flow and never change the growth rate locally, (4) the sampling positions directly correspond to the growth rate (film thickness) distribution in the direction of gas flow.

In the normal condition, the zone C ranges from the upper end of the zone D to the upper wall of the reactor and thus the openings of the sampling tubes may be located in the range. The width of the zone D is dependent on the position above the susceptor along the gas flow, the speed of the reaction gas flow supplied and the temperature of the susceptor. As a result, the zone C also changes in width. For this reason, in this embodiment, the width of the zone C where the sampling tubes are provided at a reaction condition is investigated by a preliminary experiment and then the height of the openings of the sampling tubes is determined from the result.

The numbers of the auxiliary gas nozzles and the sampling tubes for detecting the reaction gas concentration are not limited to the two nozzles 47 and 48 and the two tubes 80 and 81, respectively. Also, the numbers of the nozzles and the tubes may be different from each other. One or more nozzles and tubes can be properly selected depending on the size of the apparatus, required precision and amount of gas flow. In addition, the diameters of the gas nozzles 47 and 48 and the sampling tubes 80 and 81 should be determined to provide a minimum disturbance of gas flow in accordance with the amount of auxiliary gas to be added and the amount of gas to be sampled suitable for the analizer 84. In this embodiment, quartz pipes of outer diameters 3$\phi$ and 2$\phi$ are used for the auxiliary gas nozzles and the sampling tubes, respectively.

The susceptor 42 is tilted upward about 1° to 3° in the gas flow direction with respect to the horizontal line so that the speed of the gas flow is increased to decrease the thickness of the zone D or a laminar layer whereby growth rate of the layer of material is increased in the downstream side of the gas flow.

The reaction gas supply lines mainly include a main carrier gas (H$_2$) pipe line $\overline{49}$ for a carrier for a raw compound material, a silicon tetrachloride SiCl$_4$ pipe line $\overline{53}$ for silicon Si and an impurity doping gas pipe line $\overline{57}$. The main carrier gas pipe line $\overline{49}$ is connected through an ON-OFF valve 51 and a flow control apparatus (mass flow controller) 50 to a hydrogen gas source 52. The silicon tetrachloride pipe line $\overline{53}$ is connected to the hydrogen source for the main carrier gas 52 through a flow control apparatus 54, a valve 55 and a SiCl$_4$ babbler 56. The impurity doping gas pipe line $\overline{57}$ is connected to the SiCl$_4$ pipe line through a phosphine pH$_3$ dopant source 58, a flow control apparatus 59 and a valve 60.

Although the SiCl$_4$ gas and H$_2$ gas containing the dopant flowing in the SiCl$_4$ pipe line $\overline{53}$ are partially discharged from an exhaust 62 through a needle valve, the most of the gases are mixed into the gas of the main carrier H$_2$ gas line $\overline{49}$ through a flow control apparatus 63 and a valve 64 and led to the reactor 43. Moreover, the H$_2$ gas containing the doping gas and SiCl$_4$ is partially supplied through flow control apparatus 65 and 67 and valves 66 and 68 to the auxiliary gas nozzles 47 and 48 within the reactor 43. At this time, the amounts of gas flow in the flow control apparatus 65 and 67 are controlled by the control apparatus 84 in accordance with the gas concentration detection results.

Pipe lines $\overline{70}$ and $\overline{71}$ are provided for purge N$_2$ gas and vapor phase etching HCl gas, respectively.

In addition to the conventional gas supply lines of the carrier H$_2$ gas pipe line $\overline{49}$, Si material (SiCl$_4$) pipe line $\overline{53}$, doping gas pipe line $\overline{57}$, purge N$_2$ gas pipe line $\overline{70}$ and vapor phase etching HCl gas pipe line $\overline{71}$, there is provided as a feature of the present embodiment the pipe line $\overline{69}$ (as indicated by the solid lines in FIG. 1) for supplying the gas concentration correcting reaction gas in accordance with the reaction gas concentration in the reactor which is detected by the analyzer 84. Although in this embodiment the gas concentration correcting gas pipe line consists of the two lines of 65-47 and 67-48, the number of the lines may be one or above corresponding to that of the auxiliary gas nozzles as described above.

Detailed description will be made of a vapor phase deposition method of semiconductor layer by use of the apparatus of FIG. 1. The Si substrates 41 are made of a 15 Ωcm resistivity boron (B) doped wafer, and placed on the susceptor 42 within the reactor 43 as illustrated. The pipe line $\overline{70}$ supplies N$_2$ gas to the reactor the gas within which is replaced by the N$_2$ gas. Then, the supply of N$_2$ gas is stopped, and the valve 51 is opened to permit passing of H$_2$ gas through the pipe line $\overline{49}$, the H$_2$ gas replacing the N$_2$ gas within the reactor. A radio frequency (RF) power is supplied to the coil 44 to heat the substrates 41 to the temperature of 1150° C. If the wafer has reached 1150° C., the pipe line $\overline{71}$ supplies to the reactor HCl gas by which the wafer surfaces are etched away up to the depth of 1 μm. After completion of vapor phase etching, only H$_2$ gas is supplied for about 10 minutes to purge the inside of the reactor and then vapor phase deposition operation is initiated on the wafer surfaces. First, the rate of H$_2$ gas flow at the flow control apparatus 50 is set at 100 l/min. Then, the valves 55 and 61 are opened to permit H$_2$ gas to flow to the exhaust 62 at the rate of about 5 l/min adjusted by the flow control apparatus 54. At this time, the temperature of the SiCl$_4$ babbler 56 is kept at, for example, 20° C. Subsequently, the valve 60 of the doping gas line $\overline{57}$ is opened to supply phosphine (PH$_3$, diluted with H$_2$) of 10 ppm to the SiCl$_4$ gas line $\overline{53}$ at the rate of 10 ml/min adjusted by the flow control apparatus 59. At this time, the flow control apparatus 64 is set at 12 l/min. Next, the needle valve 61 is closed a little and at the same time the valve 64 is opened to supply the reaction gas into the reactor, initiating growth reaction. At the instant the growth begins, the valves 82 and 83 are opened to permit part of the reaction gas in the reactor to be led to the analyzer 84 (for example, an infrared spectrophotometer) at the rate of 100 ml/min from the sampling tubes 80 and 81, respectively. The detected results are compared in the control apparatus 85. Then, the control apparatus 85 supplies to the flow adjustors 65 and 67 control signals for instructing to flow correction gas, or auxiliary reaction gas at a rate according to the results, for example, 1.2 l/min to the nozzle 47 and 1.0 l/min to the nozzle 48, respectively. Thus, the reaction gas in the reactor can be automatically controlled until the completion of the growth reaction. In this case, since the optimum flow rates of the flow control apparatus 65 and 67, or the control conditions thereof depend on the size and shape of the reactor, the other gas flow conditions, the positions of the auxiliary gas nozzles 47 and 48, and the like, it is necessary to experimentally find the optimum conditions in agreement with the aforementioned conditions. The average growth speed in this case is 1 μm/min.

If a predetermined thickness of layer is reached, the valves 64, 66 and 68 are closed (at the same time the needle valve 61 is slightly opened and the valves 82 and 83 of the sampling tubes 80 and 81 are closed), and only H$_2$ gas is supplied for about 1 minute into the reactor 43. The supply of the radio frequency (RF) power is stopped and the temperature of the wafer is lowered near the room temperatures. Then, the gas in the reactor is replaced by N$_2$ gas. The susceptor 42 is drawn out from within the reactor and the wafers or substrates are removed therefrom.

The distributions of the thickness and resistivity of the vapor-phase grown layer on the semiconductor substrates in this embodiment are improved to within ±4% and ±8%, respectively.

Also, in this embodiment, two rows of eight wafers of 75-mm diameter each, that is, total of 16 wafers are arranged in the direction of gas flow on the susceptor and a vapor phase grown layer is formed on these wafers. If the narrow distributions of grown layer as achieved in this embodiment are intended to be obtained by the conventional method, it will be necessary to almost halve the mounting area of the susceptor over which the wafers are placed in the direction of gas flow, and thus the number of wafers to be processed must be halved. In accordance with the present embodiment, the number of wafers to be processed per batch can be increased to approximately twice that by the conventional method.

Moreover, in this embodiment, the degree of the irregularity occurring on the vapor phase grown layer is substantially the same as in the prior art.

In this embodiment, although the SiCl$_4$ and phosphine PH$_3$ are used for silicon Si material and dopant, respectively, other materials such as, for example, SiHCl$_3$, SiH$_2$Cl$_2$ and SiH$_4$ and other dopants, for example, A$_s$H$_3$ and B$_2$H$_6$ can be used instead of the SiCl$_4$ and phosphine PH$_3$. Moreover, the carrier gas H$_2$ can be replaced by inactive gas such as H$_e$, A$_r$, N$_2$ or the like or mixture thereof.

The auxiliary reaction gas supplying means and reaction gas sampling tubes in the present invention, or in this embodiment, the pipe line $\overline{69}$ and tubes 80 and 81 may be inserted into the reactor from the inlet or outlet of the reactor. Moreover, coaxial tubes may be used instead of using a plurality of pipe lines, and each circular tube opening may be disposed at a different position in the reactor in the direction of gas flow.

A second embodiment of the present invention will be described.

In the reaction system as shown in FIG. 1, if the reaction gas is not supplied from the auxiliary gas nozzles, the growth rate G (μm/min) of a layer of material (such as silicon) at each part of the inside of the reaction chamber is given by the following expression (1) as is well known (for example, refer to J. Electrochem. Soc., vol. 117, No. 11, pp 1397-1401 [Nov. 1970]).

$$G = \frac{7.2 \times 10^6 D_o \cdot P_o}{\delta R T_o^2} \cdot \frac{\Delta T}{l_n(T_g/T_s)} \quad (1)$$

where, $D_o$ represents the diffusion coefficient [cm$^2$/s] of silicon reaction gas (for example, SiCl$_4$) at temperature $T=T_o=273°$ K., $P_o$ the partial pressure of the silicon reaction gas in the turbulent flow above the substrates, δ the width (cm) of the laminar layer formed in a hydrodynamic way at the boundary between the substrate surface and the turbulent flow, R the gas constant, $T_g$ the gas temperature of the turbulent gas flow, $T_s$ the surface temperature of the substrates, and $\Delta T = T_s - T_g$.

The partial pressure (concentration) $P_o$ of the reaction gas is generally decreased as it goes in the downstream direction because the gas is partially consumed for the crystal growth on the way of its flowing, and the gas temperature $T_g$ is increased as the gas goes in the downstream direction. Thus, if the distance in the direction of gas flow is represented by x, $P_o$, $\delta$ and $T_g$ are the function of the distance x as expressed by equations (2) to (4).

$$P_o = P_o(x) \quad (2)$$

$$\delta = \delta(x) \quad (3)$$

$$T_g = T_g(x) \quad (4)$$

In equation (1), the $D_o$, $T_o$ and R are constants under a constant growth condition, and also $T_s$ can be considered a constant independent of the position x in the gas flow direction. Therefore, equation (1) can be reduced to the following equation (5):

$$G(x) = K(\delta(x), T_g(x)) \cdot C(x) = K(x) \cdot C(x) \quad (5)$$

where $K(x)$ is the proportion coefficient dependent on the position x in the direction of gas flow, and $C(x)$ is the concentration of the gas in the turbulent gas flow at the position x.

That is, the growth rate $G(x)$ is the function of the width $\delta(x)$ of the laminar layer, the gas temperature $T_g(x)$ and the gas concentration $C(x)$ at that place. The $\delta(x)$ and $T_g(x)$ are difficult to be directly measured and controlled, but they can be definitely determined as $K(x)$ in accordance with x if the growth conditions are determined of reactor construction, gas flow rate and substrate temperature for the growth. Therefore, under specific reactor and growth conditions, $K(x)$ is predetermined and if $C(x)$ can be measured and controlled, $G(x)$ can be controlled. Thus, a uniform growth, $G(x) =$ constant is possible in the gas flow direction.

The feature of this embodiment will be described in detail. In the semiconductor phase vapor deposition method, a means for measuring the reaction gas concentration in the gas flow direction and a plurality of gas supply lines for supplying the additional reaction gas (i.e., the auxiliary gas) in a supplemental way are provided in the turbulent flow region or zone in the reactor between the reactor wall and the susceptor heated to a predetermined growth temperature, and semiconductor films are uniformly formed over a number of substrate wafers placed in the gas flow direction by the following procedure:

1. The reaction gas concentration in the turbulent flow zone in which reaction is progressing is measured as the function $C(x)$ of distance x in the gas flow direction.

2. The growth rate of the semiconductor film under the same reaction condition is measured as the function $G(x)$ of the distance x in the gas flow direction.

3. The proportion coefficient $K(x)$ in the relation, $G(x) = K(x) \cdot C(x)$ is determined from the measured results of 1 and 2.

4. The reaction gas concentration distribution $C'(x)$ for $G(x) =$ constant is determined by computation.

5. In order that the reaction gas concentration in the turbulent flow is $C(x) = C'(x)$, at least two auxiliary gas supply lines are controlled for their gas supply rate.

Figure 3:
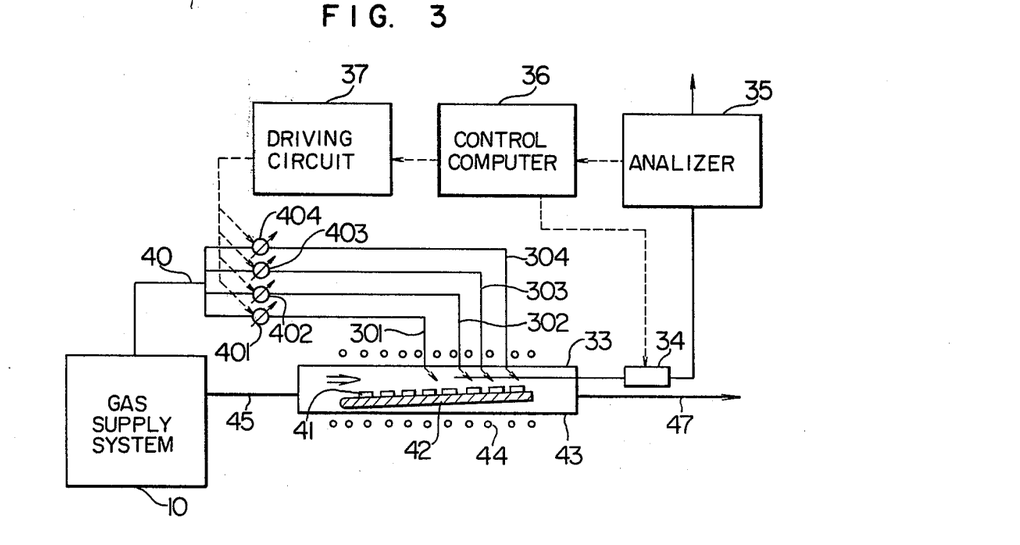
FIG. 3 is a schematical diagram of the whole reaction system to which reference is made in explaining a second embodiment of the invention.

This embodiment will further be described in detail. FIG. 3 is a schematical diagram of the entire reaction system used in this embodiment, in which like parts corresponding to those of FIG. 1 are identified by the same reference numerals. This embodiment has four auxiliary gas nozzles 301, 302, 303 and 304. The supply lines for semiconductor material gas, carrier gas, vapor etching gas, purge gas, and dopant gas are the same as those of FIG. 1, and thus they are simply represented as a gas supply system by reference numeral 10 for simplicity of drawing.

In this embodiment, a sampling tube 33 for sampling part of the gas within the reactor is provided so that the reaction gas concentration within the reactor can be detected by an analyzer 35. This sampling tube 33 can be moved back and forth by a driving means 34 thereby to enable sampling of reaction gas at any positions within the reactor in the gas flow direction. The detected results of the gas concentration at positions in the gas flow direction are fed back through a control computer 36, and a valve drive circuit 37 to valves 401, 402, 403 and 404.

In the reaction system of this embodiment, the susceptor 42 is 800 mm long, and at this time the auxiliary gas nozzles 301, 302, 303 and 304 are mounted at about 350 mm, 500 mm, 600 mm, and 700 mm from the upstream end of the susceptor. The tip ends of the auxiliary gas nozzles are slightly tilted downward, and the sampling tube 33 is provided in the turbulent zone at a position about 16 mm higher than the surface of the susceptor.

The number, shape and position of the auxiliary gas nozzles are not limited to those in this embodiment, but may be changed properly depending on the size of the reaction system, required precision, gas flow rate and the like. The diameters of the auxiliary gas nozzles and sampling tubes 33 should be as small as possible in accordance with the rate of sampling suitable for the supplemental gas supply rate and the analyzer 35 so that the disturbance of gas flow thereby is reduced as much as possible. In the case of this embodiment, the auxiliary gas nozzles used is $3\phi$ in its outer diameter and the sampling tube used is a quartz tube of outer diameter, $4\phi$ and has at its end a capillary of $50\mu\phi$ in diameter.

While in this embodiment a quadra pole mass-spectrometer is used for the analyzer 35, an infrared spectroscope may be used instead thereof. The susceptor 42 is tilted about 1° in the gas flow direction with respect to horizontal line as in the prior art so that the thickness and width of the laminar layer on the substrate wafer 41 are properly adjusted to provide as a uniform thickness of the grown layer as possible.

The method of obtaining a uniform film thickness distribution in the gas flow direction by use of the reaction system of FIG. 3 will be described in detail with reference to FIGS. 4A to 4E. FIGS. 4A to 4E show specific procedures for obtaining a uniform film thickness distribution in the gas flow direction according to the present invention.

Figure 4A:
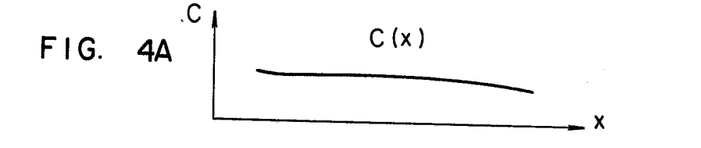
FIGS. 4A to 4E are graphs of the distributions of parameters at the respective operations in the second embodiment.

First, vapor phase deposition of semiconductor is performed by the conventional method without operating the auxiliary gas supply lines. In this case, growth conditions are predetermined such that, for example, the substrate temperature is kept at 1100° C., the flow rate of all carrier gas $H_2$ is 190 l/min and the $SiCl_4$ concentration in the supplied gas (at inlet of the reactor) is fixed to be about 0.7 mol %. While the growth reaction is being progressed, the $SiCl_4$ gas concentration C in the turbulent flow above the susceptor is measured as the function C(x) of the distance x in the gas flow direction. The C(x) thus measured is shown in FIG. 4A. This gas concentration distribution C(x) is stored in the computer.

Figure 4B:
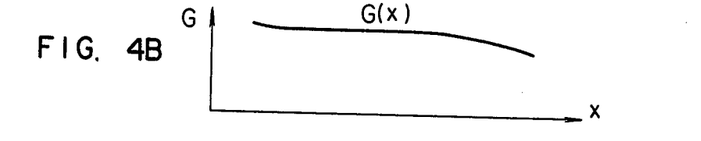

Then, the growth rate distribution G(x) of the semiconductor grown layer under the same reaction condition is measured as the function of the distance x in the gas flow direction and supplied to the computer. The G(x) can be obtained from the measurements of the growth film thickness distribution after growth process has been made for a certain time. The measured results of G(x) are shown in FIG. 4B.

Figure 4C:
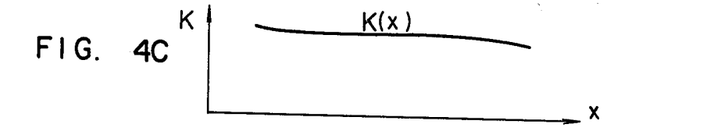

The proportion coefficient K(x) of equation (5) is calculated from the measured results of C(x) and G(x). This result is shown in FIG. 4C. This proportion coefficient K(x) is a specific coefficient for this case unless the size of reaction system, reaction temperature, and gas flow rate are changed.

Figure 4D:
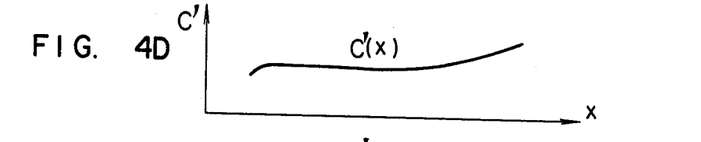

The reaction gas concentration distribution C'(x) for making constant the growth speed distribution G'(x) in the gas flow direction is calculated on the basis of this proportion coefficient K(x), and this calculated result is stored. FIG. 4D shows the calculated result of C'(x).

On the basis of the data thus obtained the flow rate control valves 401, 402, 403 and 404 of auxiliary gas supply lines in FIG. 3 are adjusted by the valve drive control circuit 37 as will be described later so that the reaction gas concentration becomes C'(x).

Figure 5:
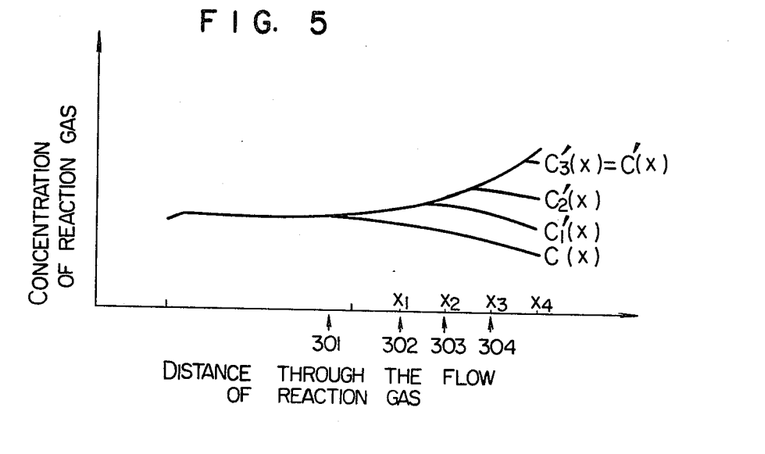
FIG. 5 is a graph of the distributions of the reaction gas concentrations within the reaction chamber when the adjustment of the auxiliary reaction gas is on the way and has been completed, in the second embodiment.

The reaction gas concentration distribution C'(x) can be obtained in the following way. FIG. 5 shows change of the reaction gas concentration distribution in the reactor while the auxiliary gas supply lines are under adjustment. While measuring the $SiCl_4$ gas concentration at the first gas concentration measuring position (near the auxiliary gas nozzle 302: $x=x_1$) as the initial reaction condition, the control valve 401 of the auxiliary gas nozzle 301 line is adjusted so that the concentration C'(x) at this point becomes a value $C'(x_1)$ at its position. By this operation, the reaction gas concentration distribution $C'_1(x)$ can be obtained.

Then, the gas concentration measuring position is changed to the second measuring position (near the auxiliary gas nozzle 303: $x=x_2$). While measuring the $SiCl_4$ gas concentration at this position, the control valve 402 of the auxiliary gas nozzle 302 line so that the gas concentration C'(x) at this point becomes a value $C'(x_2)$ at its position. By this operation, the reaction gas concentration distribution $C'_2(x)$ can be obtained. Further, the same operation is repeated for the third and fourth measuring positions so as to obtain a modified concentration $C'_3(x)$, which is approximate to a desired concentration distribution C'(x).

Figure 4E:
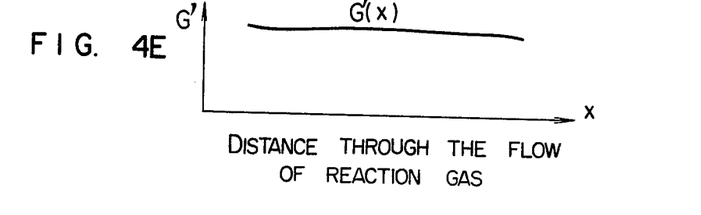

Thus, since the auxiliary gas supply lines are adjusted so that C(x)≈C'(x) by the above operations, a uniform growth rate distribution can be obtained over approximately the entire length of the susceptor as shown in FIG. 4E.

Figure 6:
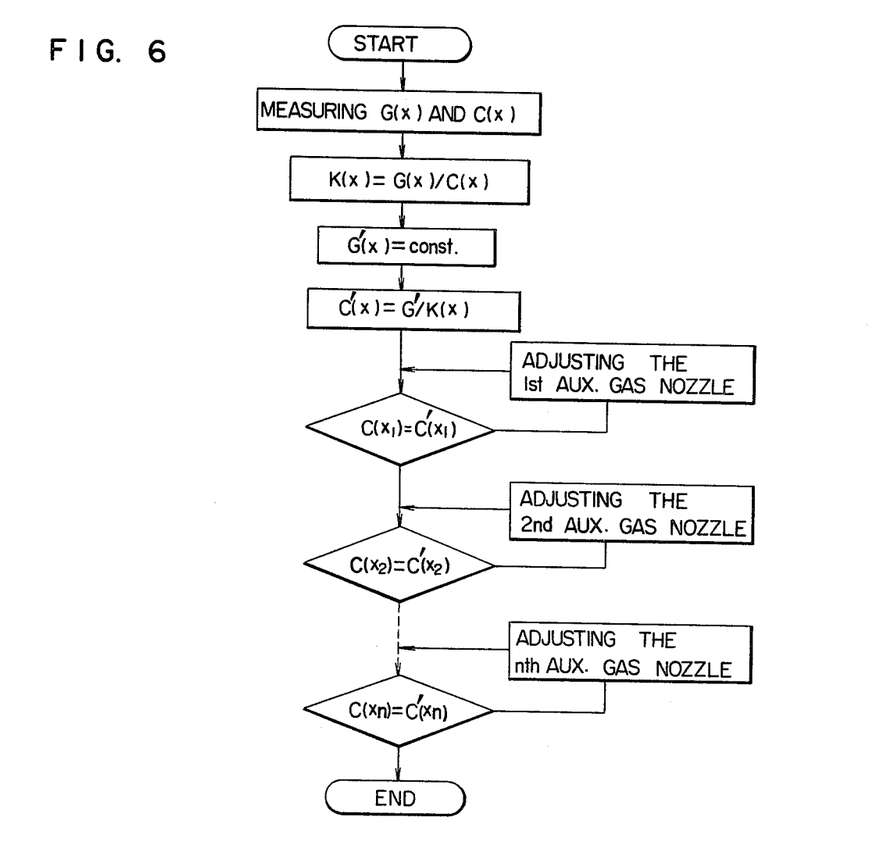
FIG. 6 is a flowchart for automatic execution of the method in the second embodiment using a control computer.

The above operations can also be automatically performed by connecting the control computer 36 to the drive circuit 37 for the auxiliary gas control valve and the drive means 34 for the measuring gas sampling nozzles and by the flowchart as shown in FIG. 6.

That is, the measured results of the C(x) and G(x) are applied to the computer, in which K(x) and C'(x) are computed and stored, and then the reaction gas concentrations downstream each auxiliary gas supplying position within the reactor is measured successively. The results are fed back to the control circuit for the gas flow rate control valve of each auxiliary gas supplying line, so that in order to obtain C(x)=C'(x) the supplemental gas supply rate is automatically controlled successively from the upstream side in accordance with the flowchart of FIG. 8.

As will be evident from the above description, in accordance with this embodiment, the amount of the supplemental gas to be supplied at each auxiliary gas nozzle position can be surely determined in a systematic way not by try and error.

In this invention, other modifications and variations can be effected.

For example, substrates to be used may be of such materials as semiconductors of silicon, germanium, insulators of sapphire and spinel or the like. As a layer of material, other semiconductors such as germanium may be deposited instead of silicon.

In addition, the opening of the auxiliary gas nozzle is not necessarily directed to a slantwise downward direction but may be parallel with the direction of gas flow. The opening may be directed either to the gas flow direction or to the reverse direction. When the direction thereof is the same as that of the gas flow, it is preferable that not to disturb the gas flow to the least degree, the auxiliary gas nozzle supplies the supplemental gas at the same rate as that of the gas flow.

We claim:

1. A method for chemical vapor deposition of layers of material individually onto the surfaces of a plurality of substrates within a reaction chamber having a primary gas inlet at one end and a gas exhaust at another end, which comprises the steps of:
   (a) supporting a plurality of substrates within said reaction chamber with said substrates being arranged in series in a direction extending from the inlet to the exhaust,
   (b) supplying a gaseous mixture containing a gaseous compound of said material into said reaction chamber through said inlet and causing the gaseous mixture to flow through the reaction chamber over the plurality of said substrates to said exhaust,
   (c) heating said substrates to a temperature at which chemical vapor deposition onto said substrates takes place during the flow of said gaseous mixture through said reaction chamber,
   (d) removing a sample of said gaseous mixture from the flow of said gaseous mixture and from said reaction chamber at a position along the series-arranged substrates between said inlet and said exhaust,
   (e) measuring a concentration of said gaseous compound in said sample of the gaseous mixture removed from said reaction chamber, and
   (f) supplying, in addition to said gaseous mixture, an auxiliary gas which contains said gaseous compound into the flow of said gaseous mixture in said reaction chamber to compensate for the consumed gaseous compound in said reaction chamber in response to the measurement of said concentration of said gaseous compound whereby the chemical vapor deposition in said reaction chamber is maintained substantially uniform along the length of the series-arranged substrates.

2. A method for chemical vapor deposition as claimed in claim 1, wherein said gaseous compound is supplied through said auxiliary gas nozzle being located in a turbulent layer of said flow of said gaseous mixture.

3. A method for chemical vapor deposition as claimed in claim 1, wherein said sample of the gaseous mixture is taken out through at least one sampling tube having an orifice located in a turbulent layer of said flow of said gaseous mixture in said reaction chamber.

4. A method for chemical vapor deposition as claimed in claim 3, wherein said auxiliary gas nozzle is located in a portion of said flow of said gaseous mixture that is upstream of that portion of the flow where said orifice of said sample tube is located, wherein the concentration of said gaseous compound in said sample of the gaseous mixture determines a quantity of the gaseous compound which is contained in said auxiliary gas to be supplied through said auxiliary gas nozzle.

5. A method for chemical vapor deposition as claimed in claim 1, wherein said substrates are semiconductor wafers and said layers of material are layers of said semiconductor.

6. A method for chemical vapor deposition as claimed in claim 5, wherein said semiconductor comprises silicon.

7. A method for chemical vapor deposition as claimed in claim 1, wherein said substrates are monocrystalline insulator wafers and said layers of material are layers of monocrystalline silicon.

8. A method for chemical vapor deposition of layers of material onto the surfaces of a plurality of substrates within a reaction chamber having a gas inlet, a gas exhaust and a plurality of auxiliary gas nozzles which are positioned between said inlet and said exhaust, said plurality of substrates being arranged in the reacton chamber in series in a direction extending from the inlet to the exhaust, which comprises the steps of:
 (a) performing a preparatory chemical vapor deposition of said material onto said substrates with a gaseous mixture containing a gaseous compound of said material, which gaseous mixture is supplied into said reaction chamber through said inlet, whereby the desired parameters of the chemical vapor deposition system employed are determined by the following steps:
  (i) measuring a distribution of a concentration "C" of said gaseous compound in said reaction chamber by taking samples of said gaseous mixture out of the reaction chamber from a flow of said gaseous mixture as a function of $C(x)$ of a distance "x" through a direction of the flow of said gaseous mixture,
  (ii) measuring a distribution of a growth rate "G" of said layers by said chemical vapor deposition as a function $G(x)$ of said distance "x",
  (iii) calculating a proportional coefficient $K(x)$ by dividing said $G(x)$ by said $C(x)$, and
  (iv) calculating a distribution of a concentration "C" of said gaseous compound as a function $C'(x)$ of said distance "x" by dividing a constant $G'$ which is determined on the basis of said $G(x)$ by said $K(x)$, where $C'(x)$ is a desired distribution to deposit uniform layers of said material, and
 (b) performing a chemical vapor deposition of the layers of the material onto the substrates with said gaseous mixture which is supplied into said reaction chamber through said inlet and additionally with an auxiliary gas containing said gaseous compound which is supplied into said reaction chamber through said auxiliary gas nozzles positioned in the flow of gaseous mixture in said reaction chamber in order that the distribution of the concentration of said gaseous compound in said reaction chamber approaches said $C'(x)$ whereby the chemical vapor deposition in said reaction chamber is maintained substantially uniform along the length of the series-arranged substrates.

9. A method for chemical vapor deposition as claimed in claim 8, wherein the measuring in the step (i) is performed using a sampling tube having an orifice located in a turbulent layer of said flow of said gaseous mixture in said reaction chamber.

10. A method for chemical vapor deposition as claimed in claim 9, wherein the measuring in said step (i) is performed by the sampling tube which is moved through the flow of said gaseous mixture.

11. A method for chemical vapor deposition as claimed in claim 8, wherein the measuring, calculating and supplying of said gaseous mixture of said steps (a) and (b) are controlled automatically by means of a computer.

12. A method for chemical vapor deposition as claimed in claim 8, wherein said material comprises silicon.

* * * * *